(12) United States Patent
Albaric et al.

(10) Patent No.: US 12,568,707 B2
(45) Date of Patent: Mar. 3, 2026

(54) METHOD FOR THERMALLY ACTIVATING A PASSIVATION LAYER

(71) Applicant: COMMISSARIAT À L'ENERGIE ATOMIQUE ET AUX ENERGIES ALTERNATIVES, Paris (FR)

(72) Inventors: Mickaël Albaric, Grenoble (FR); David Pelletier, Grenoble (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 543 days.

(21) Appl. No.: 18/084,976

(22) Filed: Dec. 20, 2022

(65) Prior Publication Data

US 2023/0215967 A1 Jul. 6, 2023

(30) Foreign Application Priority Data

Dec. 20, 2021 (FR) ...................................... 2114036

(51) Int. Cl.
*H10F 71/00* (2025.01)
*H10F 77/30* (2025.01)

(52) U.S. Cl.
CPC ......... *H10F 71/129* (2025.01); *H10F 71/121* (2025.01); *H10F 71/128* (2025.01); *H10F 71/137* (2025.01); *H10F 77/311* (2025.01)

(58) Field of Classification Search
CPC .... H10F 71/129; H10F 71/137; H10F 71/128; H10F 71/121; H10F 77/311; H01L 31/1868; H01L 31/1804; H01L 31/02167; H01L 31/1876
See application file for complete search history.

(56) References Cited

U.S. PATENT DOCUMENTS

| | | | | |
|---|---|---|---|---|
| 10,056,514 | B2 * | 8/2018 | Bende | ................... H10F 77/227 |
| 11,588,071 | B2 * | 2/2023 | Hallam | ................... H10F 71/10 |
| 12,224,363 | B2 * | 2/2025 | Veirman | ............. H10F 77/1668 |

(Continued)

FOREIGN PATENT DOCUMENTS

| | | |
|---|---|---|
| CN | 111162143 A | 5/2020 |
| EP | 2 472 601 A2 | 7/2012 |

(Continued)

OTHER PUBLICATIONS

Search Report as issued in French Patent Application No. FR2114036, dated Jun. 27, 2022.

(Continued)

*Primary Examiner* — Earl N Taylor
(74) *Attorney, Agent, or Firm* — Pillsbury Winthrop Shaw Pittman LLP

(57) ABSTRACT

A method for thermally activating a passivation layer disposed on a photovoltaic cell. The photovoltaic cell includes a first face, a second face opposite to the first face, and side surfaces connecting the first and second faces. The passivation layer covers at least one of the side surfaces of the photovoltaic cell. The method includes exposing the first face to electromagnetic radiation emitted by a radiation source. The electromagnetic radiation is applied to the first face along a line. The line sweeps at least part of the first face and is oriented relative to the first face so as to provide an overheating zone encompassing at least part of the passivation layer.

20 Claims, 7 Drawing Sheets

(56)        References Cited

U.S. PATENT DOCUMENTS

| | | | |
|---|---|---|---|
| 2010/0124619 A1 | 5/2010 | Xu et al. | |
| 2022/0246774 A1 * | 8/2022 | Veirman | H10F 10/166 |
| 2023/0215967 A1 * | 7/2023 | Albaric | H10F 71/129 |
| | | | 438/57 |

FOREIGN PATENT DOCUMENTS

| | | | | |
|---|---|---|---|---|
| FR | 3099294 A1 * | 1/2021 | | H10F 71/10 |
| FR | 3112892 A1 * | 1/2022 | | H10F 71/129 |
| FR | 3112899 A1 * | 1/2022 | | H10F 10/166 |
| KR | 10-1424538 B1 | 8/2014 | | |
| WO | WO-2015150382 A1 * | 10/2015 | | H10F 19/70 |
| WO | WO 2020/127896 A1 | 6/2020 | | |
| WO | WO 2020/220079 A1 | 11/2020 | | |
| WO | WO 2021/018757 A1 | 2/2021 | | |
| WO | WO 2022/018254 A1 | 1/2022 | | |
| WO | WO-2022023221 A1 * | 2/2022 | | H10F 71/1221 |

OTHER PUBLICATIONS

Fellmeth, T., "Minimizing Cut Edge Losses in Advanced Silicon Solar Cells," HighLite, TaiyangNews Open Workshop, Jun. 2021, 23 pages.

Simon, D. K., et al., "Low-thermal budget flash light annealing for $Al_2O_3$ surface passivation," Phys. Status Solidi RRL 9, No. 11, pp. 631-635, (Year: 2015), DOI 10.1002/pssr.201510306.

* cited by examiner

[Fig. 1]
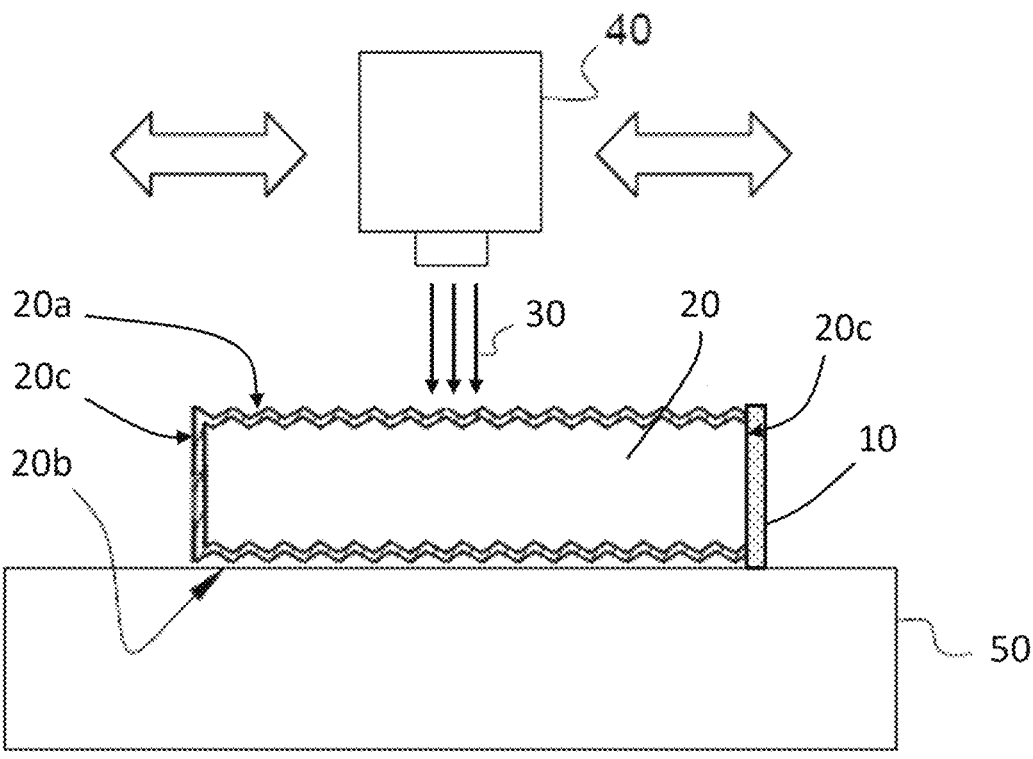
[Fig. 2]
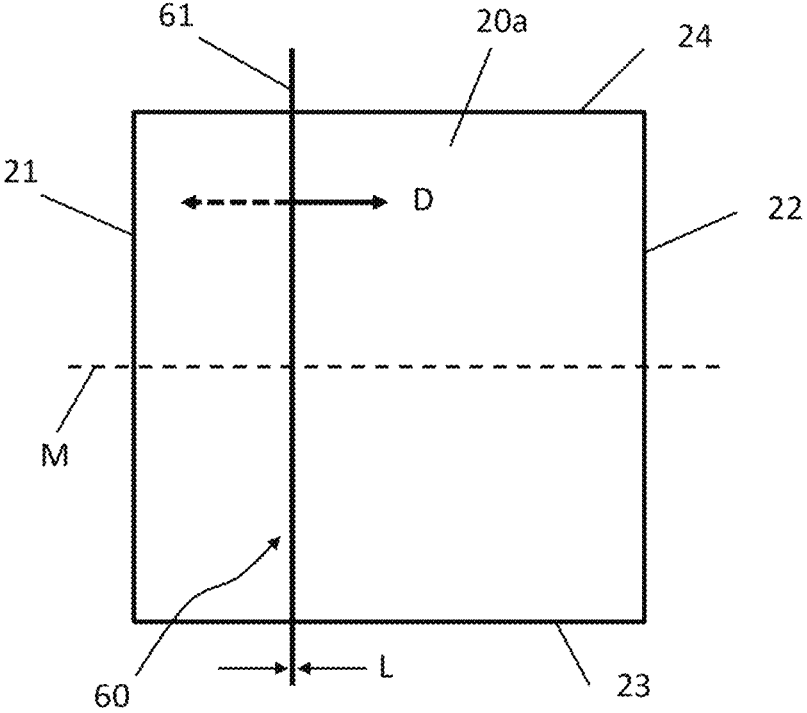

[Fig. 3]
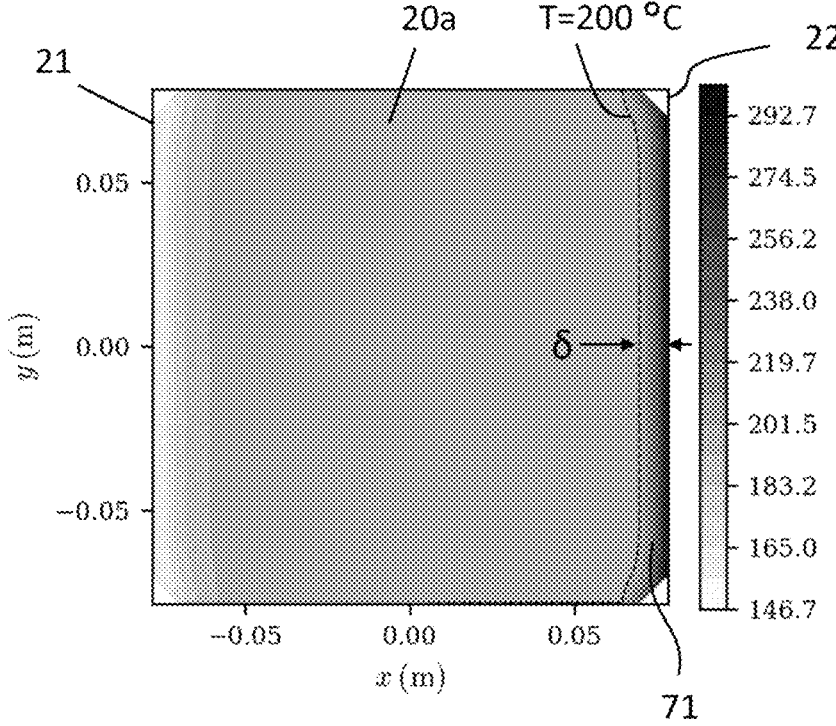
[Fig. 4]
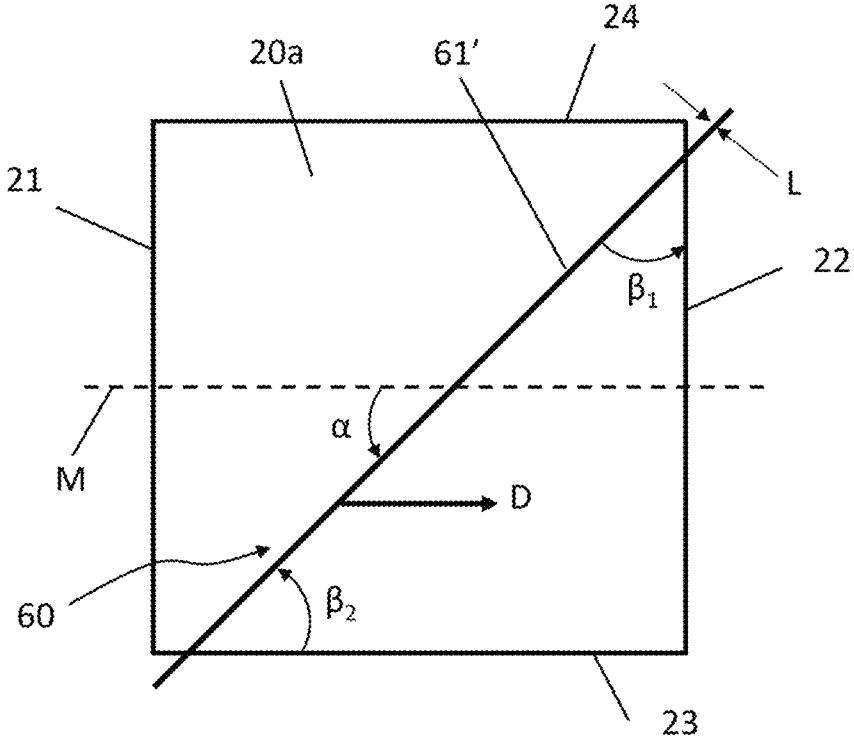

[Fig. 5]
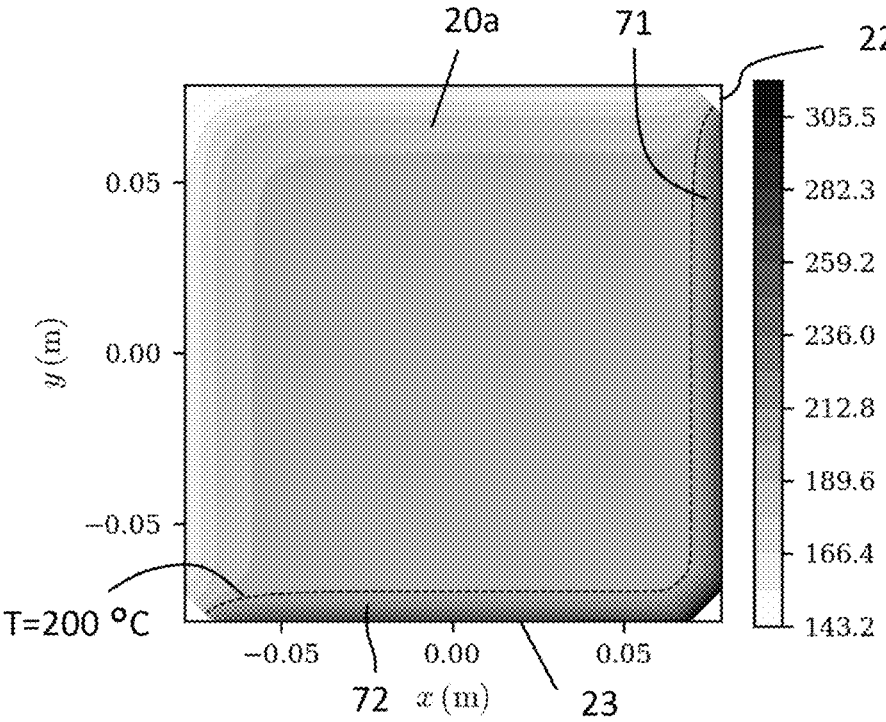
[Fig. 6]
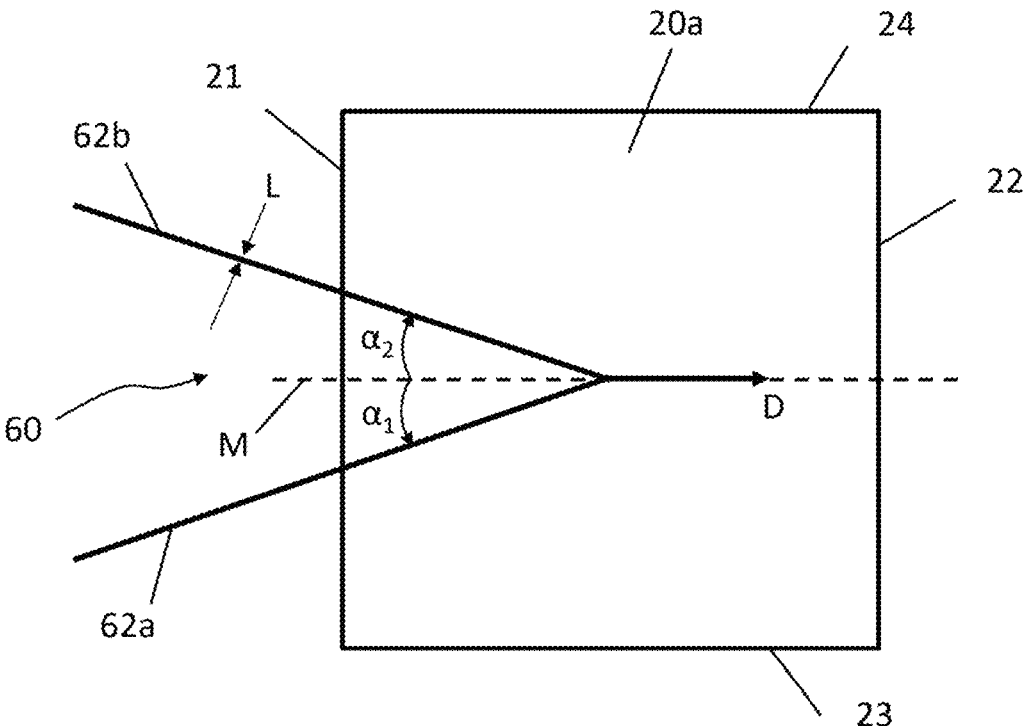

[Fig. 7]
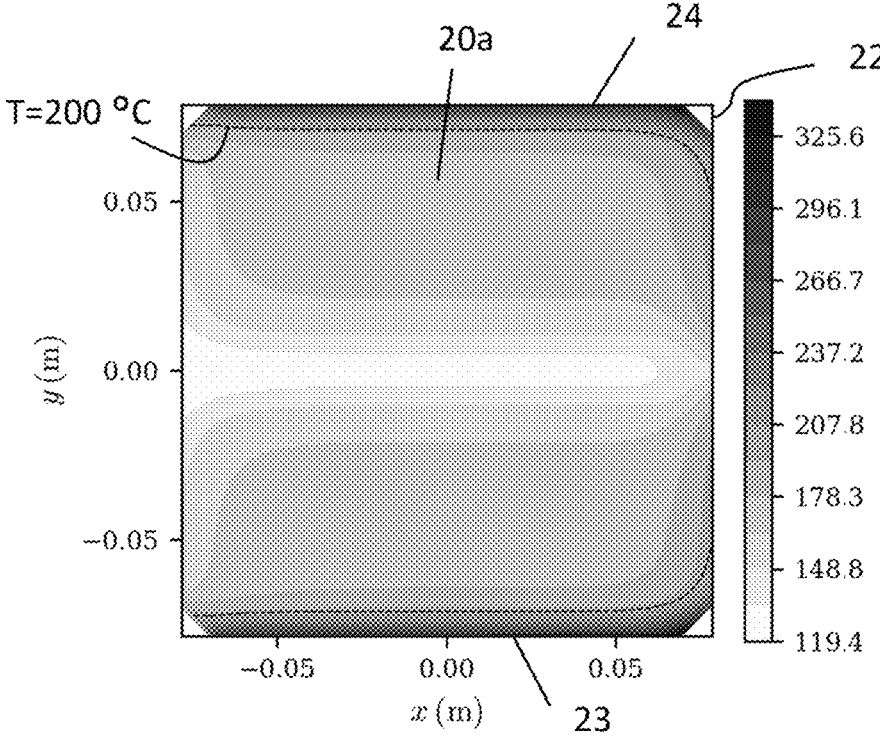
[Fig. 8A]
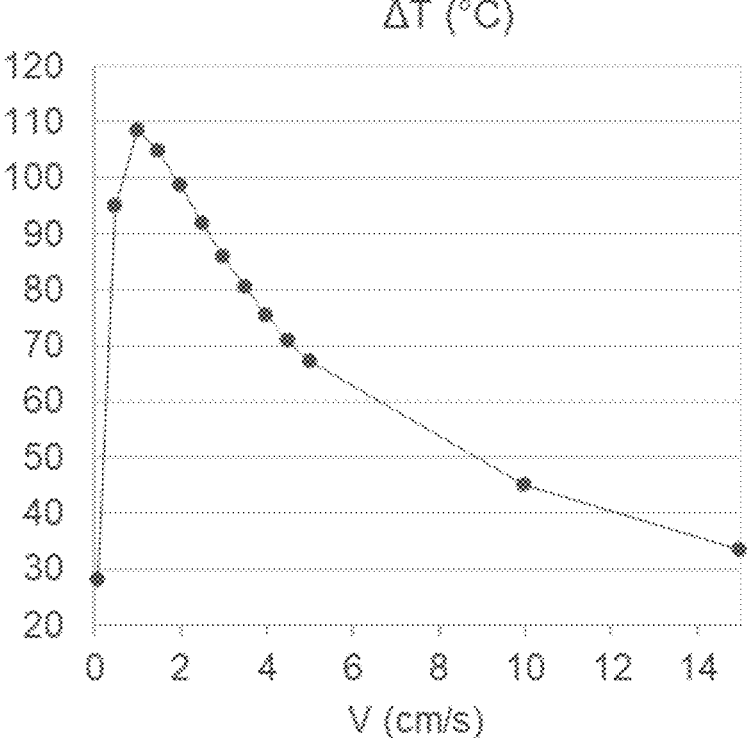

[Fig. 8B]
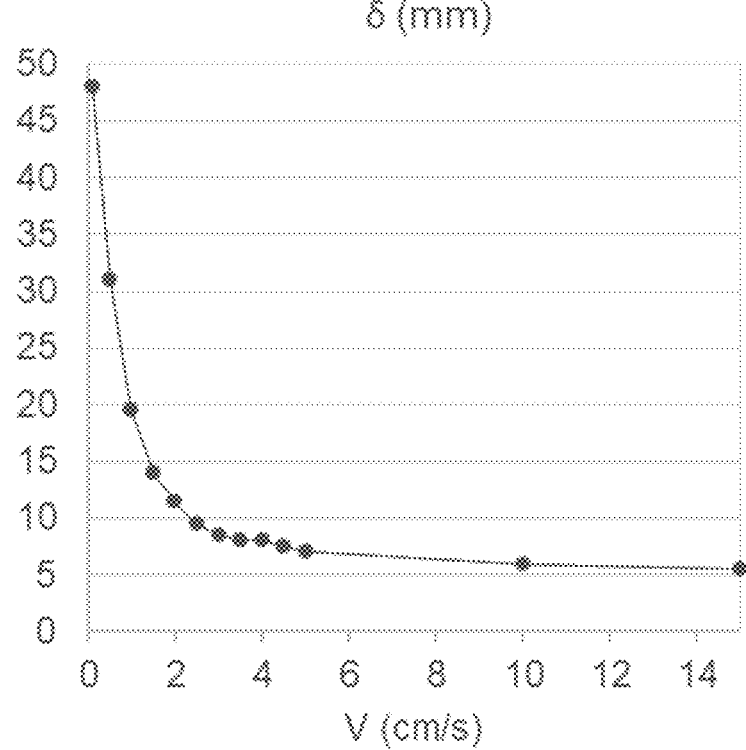
[Fig. 9]
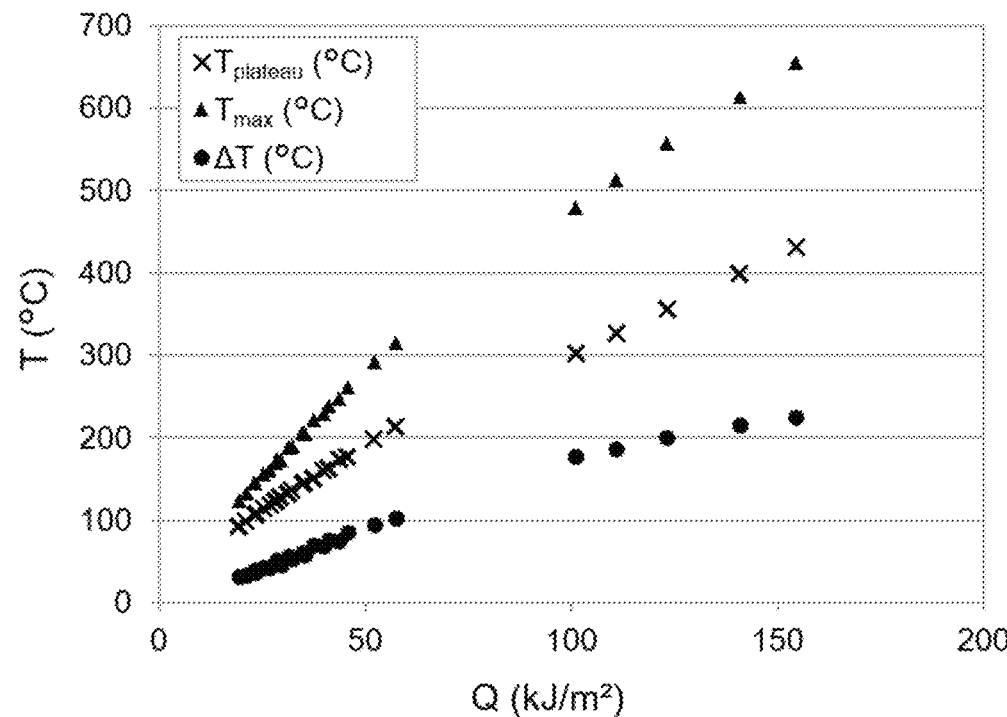

[Fig. 10]
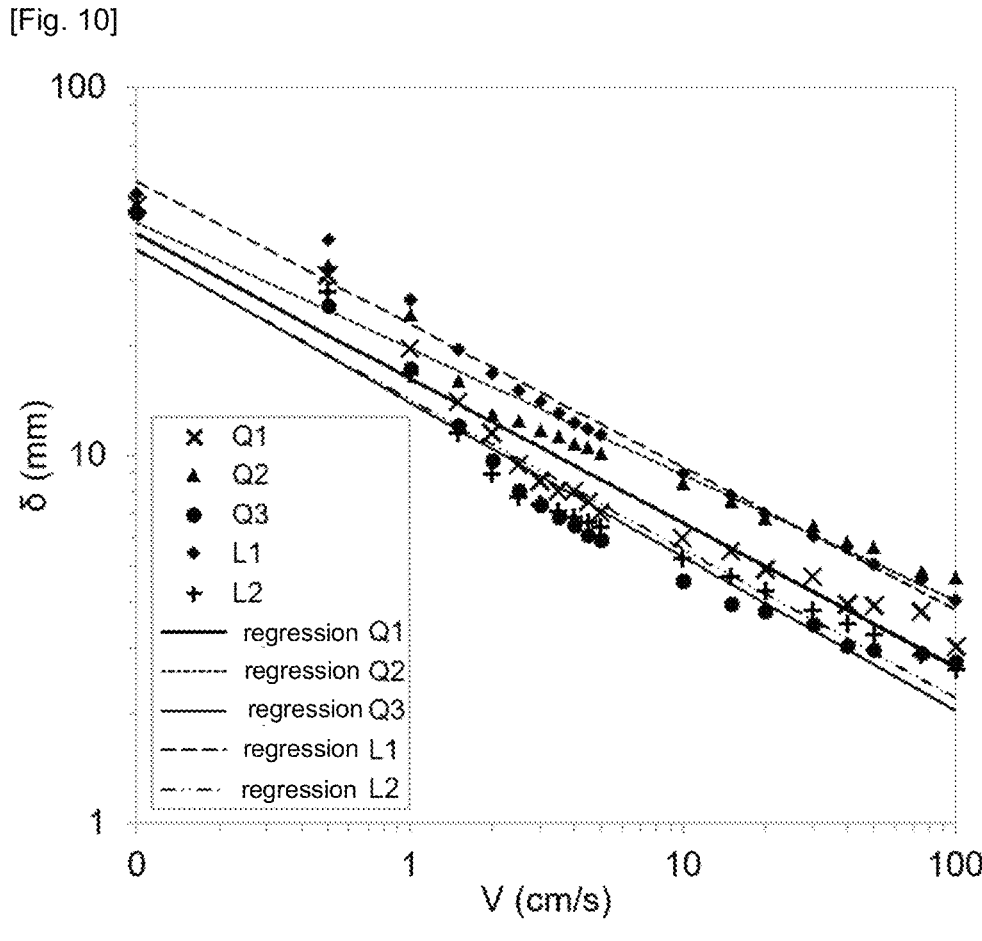
[Fig. 11A]
-S1(F1)-

[Fig. 11B]
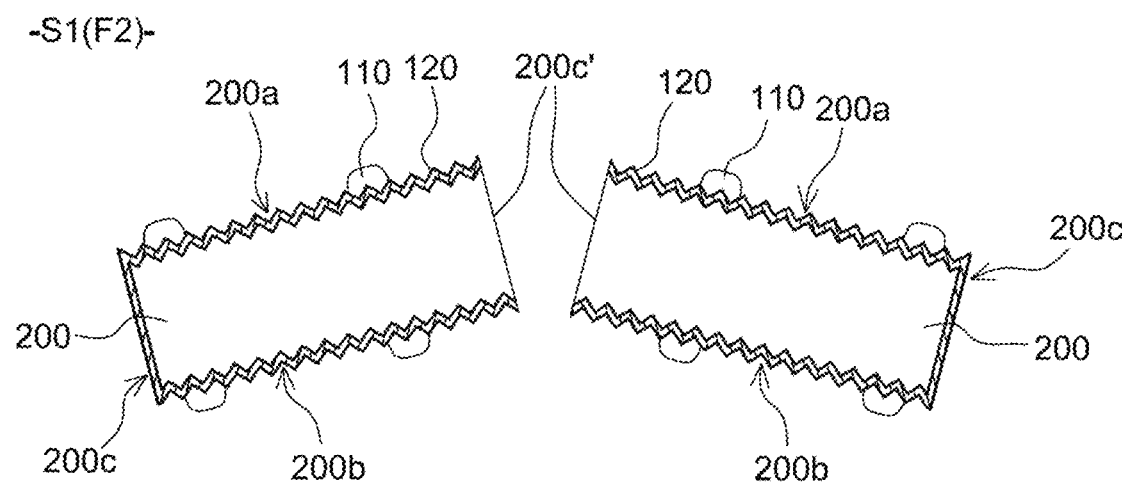
[Fig. 11C]
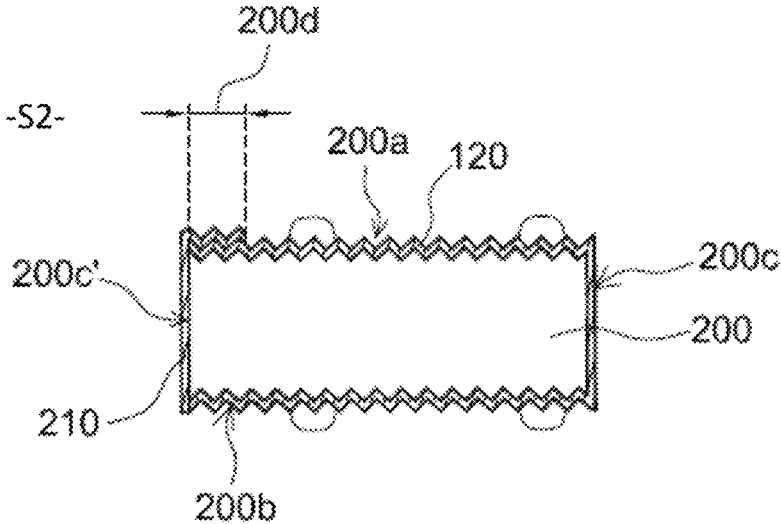

METHOD FOR THERMALLY ACTIVATING A PASSIVATION LAYER

CROSS-REFERENCE TO RELATED APPLICATIONS

This application claims priority to French Patent Application No. 2114036, filed Dec. 20, 2021, the entire content of which is incorporated herein by reference in its entirety.

TECHNICAL FIELD

The present invention is directed to the manufacture of photovoltaic modules. The invention more particularly relates to a method for thermally activating a passivation layer arranged on one or more side surfaces of a photovoltaic cell. This thermal activation method finds particularly advantageous application with photovoltaic sub-cells obtained by cutting whole photovoltaic cells.

STATE OF THE ART

A photovoltaic module comprises a multitude of identical photovoltaic cells connected in series and/or parallel. A widespread module format consists of 60 square (or "pseudo-square") cells, 156 mm on a side, divided into six strings of ten cells connected in series. The six strings of photovoltaic cells are also connected in series. The open circuit voltage across the module is then 60 times the threshold voltage of a photovoltaic cell. The electric current of the module approximately corresponds to the current supplied by each photovoltaic cell (in practice, the photovoltaic cells do not have exactly the same performance and the electric current is limited by the least efficient cell of the module).

With the latest photovoltaic cell technologies, such as TopCON (tunneling oxide passivated contact), PERC (passivated emitter and rear cell) and SHJ (silicon heterojunction), the current of a 156 mm×156 mm single-face cell reaches high values, of around 9 A at a solar irradiance of 1000 W/m². These current values are increased by about 20% when a bifacial cell is used, due to the diffuse solar radiation collected at the back of the cell. This high electric current flows through the interconnecting elements between the cells of the module and brings about significant resistive losses.

In order to reduce these resistive losses, one solution is to assemble modules with photovoltaic cells having a smaller surface area, and therefore a lower current. These smaller-area cells are usually fractions of a photovoltaic cell, commonly called "sub-cells" and obtained by cutting full size photovoltaic cells (e.g. 156 mm×156 mm).

Cutting a photovoltaic cell creates new edges which, unlike the front face and back face of the cell, are not covered with passivation layers. Furthermore, cutting (for example with a laser) is likely to create defects and introduce impurities in proximity to the cutting plane. These defects and impurities reduce life time of the free charge carriers by acting as recombination centres for the electron-hole pairs, which results in a decrease in the cell efficiency. This phenomenon is particularly pronounced for heterojunction photovoltaic cells, which by nature have very few surface defects and where the creation of a few located defects is sufficient to reduce electrical performance of the cell significantly.

To optimise performance of the photovoltaic sub-cells, it is therefore necessary to passivate the newly created edges of these sub-cells as well.

One technique is to form an alumina passivation layer ($Al_2O_3$) by atomic layer deposition (ALD) on one or more side walls of the photovoltaic sub-cells. International application WO2020/127896 on the other hand describes the formation of a passivation layer by spatial atomic layer deposition (SALD) simultaneously on several photovoltaic sub-cells.

Once the passivation layer has been deposited, a so-called "activation" step for the passivation is usually accomplished by thermal annealing to significantly improve the passivation effect. Indeed, this annealing forms fixed charges that create a field effect and causes hydrogen atoms to diffuse out and fill dangling bonds at interfaces.

International application WO2020/220079 describes cutting a photovoltaic cell into several sub-cells called "shingles" (as they are intended to be interconnected in a slightly overlapping manner, like tiles or shingles on a roof) and depositing a passivation layer (for example of $Al_2O_3$) on the cut edges of sub-cells. Depositing is followed by an activation annealing at 400° C.

Finally, the paper ["Low-thermal budget flash light annealing for $Al_2O_3$ surface passivation", D. K. Simon et al, Physica status solidi (RRL)—Rapid Research Letters, Vol. 9, No. 11, pp. 631-635, 2015] describes the deposition of an $Al_2O_3$ passivation layer onto each of the two main faces of a silicon substrate and a flash light annealing to thermally activate both passivation layers.

Annealing is accomplished by exposing both major surfaces of the substrate to light flashes (having duration equal to 1.8 ms) produced by a xenon lamp. During exposure, the substrate is placed in a hydrogen atmosphere ($H_2$) heated to a temperature of 200° C.

In general, the higher the annealing temperature, the more effective the thermal activation of a passivation layer on a photovoltaic cell. However, the photovoltaic cell can be degraded if its temperature exceeds a threshold value, typically in the order of 250° C. for a silicon heterojunction cell (SHJ) and in the order of 500° C. for a silicon homojunction cell (for example TopCON or PERC type).

SUMMARY OF THE INVENTION

There is a need for thermally activating a passivation layer disposed on at least one side surface of a photovoltaic cell, while reducing the risk of degrading the photovoltaic cell.

According to a first aspect of the invention, this need tends to be satisfied by providing a method for thermally activating a passivation layer disposed on a photovoltaic cell, the photovoltaic cell comprising a first face, a second face opposite to the first face, and side surfaces connecting the first and second faces, the passivation layer covering at least one of the side surfaces of the photovoltaic cell, the method comprising a step of exposing the first face to electromagnetic radiation emitted by a radiation source, the thermal activation method being remarkable in that the electromagnetic radiation is applied to the first face along a line, in that the line sweeps at least part of the first face and in that the line is oriented with respect to the first face so as to obtain an overheating zone encompassing at least part of the passivation layer.

By "Thermal activation", it is meant the formation of fixed charges in the passivation layer (these fixed charges creating a field effect that pushes one of the two types of free charge carriers towards the substrate of the photovoltaic cell) and/or the saturation of the dangling bonds at the surface of the crystalline silicon substrate of the photovoltaic cell (which are responsible for a large number of recombinations of electron-hole pairs)

Preferably, the first face comprises:

a first edge referred to as a leading edge;

a second edge referred to as a trailing edge and opposite to the first edge; and third and fourth edges connecting the first and second edges.

In a first embodiment of the activation method, the passivation layer covers the side surface bordered by the trailing edge, and the line comprises a line segment oriented perpendicular to a median of the first face, the median passing through the leading edge and the trailing edge.

According to one alternative embodiment, the passivation layer comprises a first portion covering the side surface bordered by the trailing edge and a second portion covering the side surface bordered by the leading edge. The line sweeps the first face in a first direction during a first phase and in a second, opposite direction during a second phase.

In a second embodiment, the passivation layer comprises a first portion covering the side surface bordered by the trailing edge and a second portion covering the side surface bordered by one of the third and fourth edges. The line comprises a line segment tilted with respect to a median of the first face by an angle strictly less than 90° in absolute value, the median passing through the leading edge and the trailing edge.

In a third embodiment, the passivation layer comprises a first portion covering the side surface bordered by the third edge and a second portion covering the side surface bordered by the fourth edge. The line is a broken line comprising a first line segment tilted with respect to a median of the first face by a first, positive angle and a second line segment tilted with respect to the median by a second, negative angle, the median passing through the leading edge and the trailing edge, the first angle and the second angle being less than 90° in absolute value, preferably less than 45° in absolute value.

According to one development of this third embodiment, the first angle and the second angle are between 10° and 20° in absolute value.

According to another development, the first angle and the second angle are equal in absolute value.

The activation method according to the invention may also have one or more of the following characteristics, considered individually or according to any technically possible combination:

the photovoltaic cell and the radiation source are in relative translation movement;

the line sweeps the entire surface area of the first face;

the energy surface density received at any point on the first face is between 1 kJ/m² and 1000 kJ/m², advantageously between 10 kJ/m² and 100 kJ/m²;

the electromagnetic radiation has an irradiance greater than or equal to 1 kW/m², preferably between 100 kW/m² and 5000 kW/m²;

the photovoltaic cell and the radiation source are in relative translation movement at a movement speed between 1 cm/s and 100 cm/s, preferably greater than or equal to 2 cm/s; and the line has a width of between 0.1 mm and 100 mm, preferably between 1 mm and 10 mm.

A second aspect of the invention relates to a method for manufacturing passivated photovoltaic sub-cells, comprising the following steps of:

cutting photovoltaic cells to form a plurality of photovoltaic sub-cells, each photovoltaic sub-cell comprising a first face, a second face opposite to the first face, and side surfaces connecting the first and second faces, at least one of the side surfaces of each photovoltaic sub-cell, called an additional surface, resulting from cutting of a photovoltaic cell;

depositing a passivation layer onto at least one additional side surface of the photovoltaic sub-cells;

thermally activating the passivation layer of the photovoltaic sub-cells by following a thermal activation method according to the first aspect of the invention.

Preferably, the photovoltaic cells are cut into half-cells or sub-units with a surface area smaller than that of a half-cell.

BRIEF DESCRIPTION OF THE FIGURES

Further characteristics and advantages of the invention will become clearer from the following description thereof given below, by way of indicating and in no way limiting purposes, with reference to the following figures.

FIG. 1 schematically represents a method for thermally activating a passivation layer according to a first aspect of the invention, which method comprises sweeping a photovoltaic cell with a line of electromagnetic radiation.

FIG. 2 represents a first embodiment of the sweep activation method according to the invention.

FIG. 3 shows the maximum temperature reached in the thickness of a photovoltaic cell for each point of a face exposed to electromagnetic radiation, during an activation method according to FIG. 3.

FIG. 4 shows a second embodiment of the sweep activation method according to the invention.

FIG. 5 shows the maximum temperature reached in the thickness of a photovoltaic cell for each point of the face exposed, during an activation method according to FIG. 4.

FIG. 6 represents a third embodiment of the sweep activation method according to the invention.

FIG. 7 shows the maximum temperature reached in the thickness of the photovoltaic cell for each point of the face exposed, during an activation method according to FIG. 6.

FIG. 8A shows the overheating amplitude in a portion adjacent to a trailing edge of the photovoltaic cell, as a function of the sweep speed of the electromagnetic radiation.

FIG. 8B shows the width of the overheated portion as a function of the sweep speed of the electromagnetic radiation.

FIG. 9 shows temperatures at two points of the photovoltaic cell and the temperature difference between these two points, as a function of the energy surface density supplied to the photovoltaic cell, when the entire face of the photovoltaic cell is swept by electromagnetic radiation.

FIG. 10 shows the width of the overheated portion as a function of the sweep speed of the electromagnetic radiation, for different calculation series.

FIG. 11A, FIG. 11B and FIG. 11C represent steps of a method for manufacturing photovoltaic sub-cells according to a second aspect of the invention.

For the sake of clarity, identical or similar elements are marked with identical reference signs throughout the figures.

DETAILED DESCRIPTION

FIG. 1 schematically represents a method for thermally activating a passivation layer 10 disposed on a photovoltaic cell 20.

The photovoltaic cell 20 comprises a first face 20a, a second face 20b opposite to the first face 20 and side surfaces 20c connecting the first and second faces 20a-20b.

The first face 20a and the second face 20b can be referred to as "main" faces because of their surface area which is much greater than that of the side surfaces 20c. Preferably, they are of the same dimensions and extend along planes parallel to each other. They may also have surface texturing, as illustrated in FIG. 1. One of the first and second faces 20a-20b constitutes the front face of the photovoltaic cell 20, that is the face to be exposed to the incident solar radiation, while the other constitutes the back face of the photovoltaic cell 20.

The first and second faces 20a-20b of the photovoltaic cell 20 preferably have a rectangular or overall rectangular, for example square or pseudo-square, shape. By "overall rectangular", it is meant that one or more corners of the first and second faces 20a-20b may be truncated or rounded. For example, in a pseudo-square format photovoltaic cell 20, all four corners of the first and second faces 20a-20b of the photovoltaic cell 20 are truncated or rounded.

Thus, the photovoltaic cell 20 has the overall shape of a rectangular parallelepiped. The thickness of the photovoltaic cell 20 (measured perpendicular to the first and second faces 20a-20b) is typically between 50 μm and 200 μm.

The passivation layer 10 covers one or more side surfaces 20c of the photovoltaic cell 20. It is intended to increase lifetime of the free charge carriers in the photovoltaic cell 20, by reducing the number of electron-hole pair recombinations at the surface of the photovoltaic cell 20, and thereby increase the conversion efficiency of the photovoltaic cell 20. The passivation layer 10 may cover all side surfaces 20c. It may also cover part of the first face 20a and/or part of the second face 20b (typically strips adjoining the side surfaces covered).

The passivation layer 10 is for example comprised of alumina ($Al_2O_3$), silicon dioxide ($SiO_2$), silicon nitride ($Si_3N_4$) or amorphous hydrogenated silicon nitride (a-$Si_xN_y$:H). It can be formed by atomic layer deposition (ALD) or by chemical vapour deposition (CVD), plasma-assisted (PEALD or PECVD) or not. It can also be obtained by spatial atomic layer deposition (SALD). The spatial atomic layer deposition technique is a variant of the conventional, so-called "temporal" ALD technique. In this alternative, the different precursor gases for the deposition of the material are separated in space rather than in time.

The passivation layer 10 preferably comprises hydrogen atoms. Hydrogen can be supplied during the deposition of the layer or after deposition by means of an ion implantation step (low temperature method).

With reference to FIG. 1, the activation method comprises a step of exposing the first face 20a of the photovoltaic cell 20 to electromagnetic radiation 30 emitted by a radiation source 40. The electromagnetic radiation 30 is preferably directed perpendicular to the first face 20a.

The electromagnetic radiation 30 is, at least in part, absorbed by the photovoltaic cell 20 and converted into heat, thereby thermally activating the passivation layer 10.

During the exposure step, also called an irradiation step, the photovoltaic cell 20 and the radiation source 40 are advantageously in relative translation movement (i.e. one moves with respect to the other). For example, the photovoltaic cell 20 may be placed on a translationally movable support 50 and the source 40 may be fixed. Conversely, the support 50 of the photovoltaic cell 20 may be fixed and the source 40 may be movable. Both the photovoltaic cell 20 and the source 40 may also be movable, but not in the same direction and at the same speed.

In particular, the support 50 may be a substrate holder or a conveyor capable of transporting several photovoltaic cells 20 simultaneously.

Such a translation movement makes it possible to irradiate most of the first face 20a of the photovoltaic cell 20 using a radiation source 40 having an irradiation surface area smaller than the surface area of the first face 20a (especially in the case of a laser system). It also allows several photovoltaic cells 20 to be irradiated successively, these photovoltaic cells being disposed on the same support 50, for example. In this case, the photovoltaic cells 20 can be considered to be moving in front of the radiation source 40.

The electromagnetic radiation 30 has an irradiance E, also called energy lighting or light power surface density, which is advantageously greater than or equal to 1 $kW/m^2$, preferably between 100 $kW/m^2$ and 5000 $kW/m^2$. The irradiance E represents the power of the electromagnetic radiation received per unit area, this unit area being oriented perpendicularly to the direction of the electromagnetic radiation 30. Such an irradiance allows the photovoltaic cell 20 to be heated quickly to a temperature that allows thermal activation of the passivation layer 10.

In order to thermally activate the passivation layer 10 disposed on the photovoltaic cell 20, it is not mandatory to expose the second face 20b or the side surfaces 20c of the photovoltaic cell 20. Instead, the first face 20a may be irradiated entirely. Preferably, all exposed regions of the first face 20a receive the electromagnetic radiation 30 during the same treatment duration t.

The radiation source 40 may be a laser system comprising, for example, one or more laser arrays, a set of light emitting diodes or any other device capable of emitting electromagnetic radiation with an irradiance greater than 1 $kW/m^2$.

The electromagnetic radiation 30 may be monochromatic, that is have only one wavelength, or polychromatic, i.e. have several (monochromatic) components of different wavelengths. More specifically, the electromagnetic radiation 30 has at least one wavelength between 300 nm and 1200 nm (in this range, the radiation is at least partially absorbed in the photovoltaic cell 20).

FIGS. 2, 4 and 6 show different embodiments of the method for activating the passivation layer 10.

The first face 20a (defined as the face exposed to the electromagnetic radiation 30) comprises:

a first edge 21 referred to as a leading edge and defined as the edge to be passed first in front of the radiation source 40;

a second edge 22 referred to as a trailing edge, opposite to the first edge 21 and defined as the edge to be passed last in front of the radiation source 40; and third and fourth so-called transverse edges 23-24 (lower and upper edges in the figures) which connect the first and second edges 21-22.

As previously indicated, the first face 20a of the photovoltaic cell 20 preferably has a rectangular or overall rectangular shape (truncated or rounded angles). The leading edge 21 and the trailing edge 22 are thus parallel to each other, as are the transverse edges 23-24.

In a manner common to all embodiments, the radiation source 40 is configured so that the electromagnetic radiation 30 is applied to the first face 20a along a line 60. In other words, the surface of the photovoltaic cell 20 irradiated by the radiation source 40 (referred to as the irradiation surface) at a given time instant of the activation method is lineshaped. The line 60 has a width L which may be between 0.1 mm and 100 mm, preferably between 1 mm and 10 mm.

The line 60 may comprise one or more line segments 61, 61', 62a-62b. The line segments may be connected, thus forming a broken line, or on the contrary they may be disjoint. The line 60 is thus the intersection of a beam of electromagnetic waves generated by the radiation source 40 with the surface of the photovoltaic cell 20, the rays of the beam being contained in one or more, secant or not secant, planes.

The direction D of the relative movement between the photovoltaic cell 20 and the radiation source 40 is such that the line 60 sweeps at least part of the first face 20a of the photovoltaic cell 20 during the exposure step. Sweeping by the line 60 may start at the leading edge 21 and end at the trailing edge 22. It may also start at a position between the leading edge 21 and the trailing edge 22 (in other words after the leading edge 21 has passed in front of the radiation source 40) and end at the trailing edge 22.

The direction of movement D of the radiation source 40 relative to the photovoltaic cell 20, also called the sweeping direction D, is for example perpendicular to the leading edge 21 and the trailing edge 22, as is represented in FIGS. 2, 4 and 6.

The speed V of the relative movement between the photovoltaic cell 20 and the radiation source 40 is preferably chosen so as to treat a photovoltaic cell 20 by sweeping the electromagnetic radiation in a short time t, typically between 0.1 s and 30 s. The movement speed V is advantageously between 1 cm/s and 100 cm/s, and preferably greater than or equal to 2 cm/s.

This sweep activation method is simple and fast to implement. By continuously moving the photovoltaic cells 20 in front of the radiation source 40, the activation method can be performed at a high rate, compatible with photovoltaic cell industrial production requirements.

For example, considering a movement speed V between 1 cm/s and 100 cm/s and photovoltaic cells 20 with main faces 20a-20b measuring 156 mm by 156 mm, the treatment time t of a photovoltaic cell 20 is between 0.156 s and 15.6 s. The number of photovoltaic cells 20 treated per hour can be between 200 and 25000.

As will be shown later by means of thermal simulations, sweeping a line of electromagnetic radiation results in heating the photovoltaic cell 20 non-uniformly, in contrast to a conventional annealing furnace or to a simultaneous exposure of the entire first face 20a of the photovoltaic cell (so-called "full plate" exposure). More precisely, the temperature of the photovoltaic cell 20 very sharply increases in a portion located near one or more edges of the first face 20a.

The activation method according to the invention makes use of this local overheating phenomenon to activate the passivation layer 10 disposed on one or more side surfaces 20c of the photovoltaic cell 20. The line 60 is oriented with respect to the first face 20a so as to obtain an overheating zone that encompasses at least part of the passivation layer 10, and preferably the entire passivation layer 10. The passivation effect of the passivation layer 10 can thus be greatly improved while reducing the risk of degrading the photovoltaic cell 20.

The activation method can be characterised by the following parameters:
  E: the irradiance of the electromagnetic radiation 30 (in kW/m²);
  V: the speed of relative movement between the photovoltaic cell 20 and the radiation source 40, also called the sweep speed of the electromagnetic radiation (in cm/s);

L: the width of line 60 (in mm); and
  e: the thickness of the photovoltaic cell 20 (in μm).

The energy surface density Q (in kJ/m²), or surface energy, received at any point on the face of the photovoltaic cell by electromagnetic radiation is defined by the following relationship $$Q=(E*L)/(10*V) \qquad \text{[Math. 1]}$$

The parameters E, V and L are preferably chosen to obtain an energy surface density Q between 1 kJ/m² and 1000 kJ/m², advantageously between 10 kJ/m² and 100 kJ/m². The ranges of values given above for irradiance E of the electromagnetic radiation 30, the sweep speed V and the width L of the line 60 are sufficiently wide to achieve this.

Thermal simulations have shown that temperatures at different points of the photovoltaic cell during the exposure step increase with the energy surface density Q. Furthermore, for a given combination of parameters E, V and L, other thermal simulations have shown that these temperatures depend on the thickness e of the photovoltaic cell. The smaller the thickness e of the photovoltaic cell, the higher the temperatures, as the volume density of absorbed energy increases. All the simulation results set forth below have been obtained with a cell thickness e of 160 μm.

In a first embodiment illustrated in FIG. 2, the line 60 comprises a line segment 61 oriented perpendicularly to a median M of the first face 20a of the photovoltaic cell 20. The median M is the line segment that connects the midpoints of the leading edge 21 and the trailing edge 22. It is preferably perpendicular to the leading edge 21 and the trailing edge 22. The radiation source 40 is advantageously dimensioned so that the line 60 irradiates the entire width of the photovoltaic cell 20.

FIG. 3 is a mapping of the maximum temperature reached in a photovoltaic cell 20 (whose main faces are pseudo-square: 156 mm×156 mm) during an activation method according to FIG. 2. It has been obtained by means of a thermal simulation of the sweep activation method. In this first and subsequent simulations, irradiance E of the electromagnetic radiation is equal to 216 kW/m², the sweep speed V is equal to 2.48 cm/s and the width of the line 60 is equal to 6 mm. The dashed line curve represents the T=200° C. isotherm.

This mapping shows that the maximum temperature of the photovoltaic cell 20 during exposure is lowest in proximity to the leading edge 21 (exposed first to the electromagnetic radiation 30), increases progressively towards the trailing edge 22 to reach (and remain at) a so-called plateau temperature in the order of 195° C., and then further increases to exceed 200° C. in a portion 71 adjacent to the trailing edge 22 (i.e. the edge exposed last to the electromagnetic radiation 30). Outside of this so-called "overheated" portion 71, the maximum temperature of the photovoltaic cell 20 is therefore less than 200° C.

The local overheating near the trailing edge 22 is due to the formation of a thermal boundary layer frontwardly of the beam. This thermal boundary layer is related to heat diffusion and propagates in the photovoltaic cell from the leading edge 21 to the trailing edge 22. When approaching the trailing edge 22, heat can no longer diffuse frontwardly of the beam, which causes overheating.

FIG. 3 also shows that the temperature of the photovoltaic cell is equal to the plateau temperature in a major part of the photovoltaic cell, this part being referred to here as a "central" part because it is disposed between the leading edge 21 and the trailing edge 22 and contains the point located at the centre of the face 20a exposed, at (x,y)=(0,0).

The activation method according to the first embodiment is accomplished when the passivation layer 10 covers the side surface 20c bordered by the trailing edge 22 of the first face 20a, in other words when the passivation layer 10 runs along the trailing edge 22 (in practice, the cell is oriented with respect to the direction of movement D so that the side surface 20c covered by the passivation layer 10 corresponds to the trailing edge 22).

According to a development of the first embodiment (illustrated by a dotted arrow in FIG. 2), the line 60 sweeps the first face 20a from the leading edge 21 towards the trailing edge 22 during a first phase of the exposure step and from the trailing edge 22 towards the leading edge 21 during a second phase of the exposure step. Sweeping the line 60 in both opposite directions of the direction of movement D results in an overheated zone comprising two (disjoint) portions: one adjacent to the trailing edge 22 (the overheated portion 71 of FIG. 3) and the other adjacent to the leading edge 21.

This alternative embodiment enables thermal activation of a passivation layer 10 comprising a first portion covering the side surface 20c bordered by the trailing edge 22 and a second portion covering the side surface 20c bordered by the leading edge 21 (in other words where the passivation layer 10 runs along the leading edge 21 and the trailing edge 22).

In a second embodiment represented by FIG. 4, the line 60 comprises a line segment 61' tilted with respect to the median M by an angle α (non-zero) strictly less than 90° in absolute value, and preferably between 30° and 60° in absolute value. The angle α refers to the smallest measurable angle between the line 60 and the median M. It may be positive or negative.

The tilt of the line 60 with respect to the median M has the effect of moving at least part of overheating towards one of the two transverse edges 23-24 of the first face 20a.

FIG. 5 is another mapping of the maximum temperature reached in the photovoltaic cell, obtained by thermal simulation of the activation method according to FIG. 4 taking as an example an angle α positive and equal to 45°.

In this example, the overheating (T>200° C.) occurs in the portion 71 adjacent to the second edge 22 (trailing edge) and in a portion 72 adjacent to the third edge 23 (lower transverse edge). The line 60 forms with each of these two edges 22, 23 an angle $\beta_1$, $\beta_2$ equal to 45° (see FIG. 4).

The activation method according to the second embodiment is accomplished when the passivation layer 10 comprises a first portion covering the side surface 20c bordered by the trailing edge 22 and a second portion covering the side surface 20c bordered by one of the transverse edges 23-24 (in other words when the passivation layer 10 runs along the trailing edge 22 and one of the transverse edges 23-24).

FIG. 6 represents a third embodiment of the activation method in which the line 60 is a broken line. The line 60 comprises a first line segment 62a tilted with respect to the median M by a first (strictly) positive angle $\alpha_1$ and a second line segment 62b tilted with respect to the median M by a second (strictly) negative angle α2. The first angle $\alpha_1$ and the second angle $\alpha_2$ are non-zero angles less than 90° in absolute value, preferably less than 45° in absolute value. The line 60 then has an arrow (or chevron) shape.

An arrow-shaped line 60 makes it possible to move overheating at least in part from the trailing edge 22 to the two transverse edges 23-24 of the first face 20a, instead of just one of these edges in the second embodiment (FIGS. 4-5).

Each of the angles $\alpha_1$ and $\alpha_2$ is preferably between 10° and 20° in absolute value. The overheating is then almost exclusively along both transverse edges 23-24.

FIG. 7 shows as an example the maximum temperature in the photovoltaic cell 20 obtained by thermal simulation of the activation method according to FIG. 6, when the angles $\alpha_1$ and $\alpha_2$ are both 20°.

The activation method according to the third embodiment is accomplished when the passivation layer 10 comprises a first portion covering the side surface 20c bordered by the third edge 23 and a second portion covering the side surface 20c bordered by the fourth edge 24 (in other words when the passivation layer 10 runs along both transverse edges 23-24).

The first angle $\alpha_1$ and the second angle $\alpha_2$ may not be equal in absolute value. Nevertheless, when they are equal, heating of the photovoltaic cell 20 is symmetrical, as illustrated by the temperature mapping in FIG. 7. This allows both portions of the passivation layer 10 to be activated in the same way.

FIG. 8A is a graph showing the overheating amplitude ΔT as a function of the sweep speed V of the electromagnetic radiation. The overheating amplitude ΔT is the temperature difference between the hottest point in the overheated portion 71 and the point at the centre of the exposed face, at (x,y)=(0,0).

FIG. 8B is a graph showing the width δ of the overheated portion 71 as a function of the sweep speed V of the electromagnetic radiation. The width δ of the overheated portion 71 is measured from the trailing edge 22 of the photovoltaic cell 20, perpendicular to this edge and on the median M of the first face 20a (at y=0).

These two figures show that, for a given energy surface density (here 60 kJ/m²), the overheating amplitude ΔT and the width δ of the overheated portion 71 decrease when the sweep speed increases (from a sweep speed of about 2 cm/s for the amplitude ΔT).

The thermal simulation results, especially those in FIG. 8B, highlight that the width δ of the overheated portion 71 is mainly governed by the sweep speed V. The width δ of the overheated portion 71 can be expressed by a power law of the following form:

$$\delta = aV^b \qquad \text{[Math. 2]}$$

where V is the sweep speed and a and b are first and second coefficients (more particularly real numbers).

FIG. 9 shows the results of other thermal simulations of the activation method according to FIG. 2, carried out with the same photovoltaic cell but varying the irradiance E of the electromagnetic radiation between 155 kW/m² and 237 kW/m² and the sweep speed V between 0.92 cm/s and 4.82 cm/s. The line 60 sweeps the entire surface area of the first face 20a of the photovoltaic cell. The plateau temperature $T_{plateau}$ at the centre of the photovoltaic cell (in x=y=0), the maximum temperature $T_{max}$ reached at the trailing edge 22 and the temperature difference ΔT between the maximum temperature $T_{max}$ and the plateau temperature $T_{plateau}$ ($\Delta T = T_{max} - T_{plateau}$) are represented as a function of the energy surface density Q resulting from the simulation parameters chosen.

It is noticed that the plateau temperature $T_{plateau}$ at the centre of the photovoltaic cell (at x=y=0) and the maximum temperature $T_{max}$ increase with the energy surface density Q supplied to the photovoltaic cell 20.

In the sweep activation method according to the invention, a value of energy surface density Q is preferably chosen that is as high as possible while maintaining a plateau temperature $T_{plateau}$ lower than or equal to the threshold temperature from which the photovoltaic cell is likely to be degraded. This threshold temperature is referred to hereafter as the "photovoltaic cell degradation temperature" and can be between 200° C. and 500° C. depending on the type and construction of the photovoltaic cell. To determine the energy surface density Q, the thickness e and the environment of the photovoltaic cell (ambient temperature, convective exchanges, etc.) are advantageously taken into account.

Once the energy surface density Q is determined, the parameters E, V and L are determined to ensure optimal implementation of the activation method. For example, a high sweep speed V allows the treatment duration t and the width δ of the overheated portion 71 to be reduced. Generally speaking, it is sought to obtain a width that is as small as possible (to limit possible degradation of the photovoltaic cell) but nevertheless sufficient to encompass the passivation layer 10, while ensuring an overheating amplitude ΔT that allows the passivation layer 10 to be effectively activated. The width δ sought is preferably between the thickness of the passivation layer 10 and 3 mm. The sweep speed V is advantageously chosen to be greater than or equal to 2 cm/s.

A campaign of thermal simulations has been conducted in order to determine the first coefficient a and the second coefficient b of the relationship δ(V) (see Math. 2). The simulation campaign consists of several series of calculations performed by taking different values for the parameters Q, E, V, L and e of the activation method. These values are given in Table 1 below for each of the series.

TABLE 1

| Series | Q (kJ/m²) | V (cm/s) | E (kW/m²) | L (mm) | e (μm) |
|---|---|---|---|---|---|
| Q1 | 60 | 0.1 to 100 | from 10 to 10,000 | 6 | 160 |
| Q2 | 10 | 0.1 to 100 | from 1.67 to 1670 | 6 | 160 |
| Q3 | 200 | 0.1 to 100 | from 33.3 to 33333 | 6 | 160 |
| L1 | 60 | 0.1 to 100 | from 3 to 3000 | 20 | 160 |
| L2 | 60 | 0.1 to 100 | from 60 to 60,000 | 1 | 160 |
| e1 | 52.3 | 2.48 | 216 | 6 | from 60 to 160 |
| M1 | from 19.3 to 155 | 0.92 to 4.82 | from 155 to 237 | 6 | 160 |

In each of the series 'Q1', 'Q2', 'Q3', 'L1' and 'L2', the sweep speed V is varied between 0.1 cm/s and 100 cm/s. The irradiance E is adjusted as a function of the speed V according to the relationship Math. 1 above to obtain the density value Q indicated. For these five series, different values of coefficients a and b have thus been obtained by linear regression (in logarithmic space).

FIG. 10 shows the results of these five sets of calculations and associated linear regressions. The corresponding values of the coefficients a and b, as well as the maximum relative error between the b values observed in the simulations and those predicted by linear regression, are given in Table 2 below.

TABLE 2

| Series | a | b | Error (%) |
|---|---|---|---|
| Q1 | 16.2 | −0.393 | 31 |
| Q2 | 19.6 | −0.343 | 25 |
| Q3 | 13.9 | −0.418 | 27 |

TABLE 2-continued

| Series | a | b | Error (%) |
|---|---|---|---|
| L1 | 22.8 | −0.388 | 23 |
| L2 | 14.2 | −0.406 | 26 |

The values of the coefficients a and b are given for V in cm/s and b in mm.

For the five series, the first coefficient a varies between about 13 and 23, the second coefficient b varies between about −0.34 and −0.42 and the maximum relative error is less than 33%.

Adjustment of the coefficients a and b as a function of the parameters Q and L can be made empirically or using other numerical simulations.

Generally speaking, the first coefficient a can be between 0 and 1000, preferably between 5 and 50, and the second coefficient b can be between −10 and 0, preferably between −1 and −0.1.

The calculation series 'e1' shows the influence of the thickness e of the photovoltaic cell 20, in a reference activation method. For a thickness e varying from 60 μm to 160 μm, the width δ of the overheated portion varies by 10%. The relationship Math. 2 defined for a given value e can therefore be reasonably used for another thickness in the range 60 μm-160 μm. Alternatively, the coefficients a and b can be adjusted according to the thickness e of the photovoltaic cell.

Finally, the series 'M1' gathers simulations corresponding to different configurations of the activation method experimentally tested. In these tests, the energy density Q ranges from 19.3 kJ/m² to 155 kJ/m². The relative error between the simulated δ-width values in the series 'M1' and those calculated by linear regression using the coefficients a and b obtained for the series 'Q1' (Q=60 kJ/m²) is less than 15%. This result confirms that for the contemplated values of energy density Q and sweep speed V, the adjustment of the coefficients a and b as a function of the energy density Q can only bring a small gain on the determination of the width δ of the overheated portion 71.

The activation method described above is applicable regardless of the type, shape and dimensions of the photovoltaic cell 20. In particular, it is applicable both to full-size photovoltaic cells (for example square or pseudo-square 156 mm×156 mm), the edges of which have not been (or not sufficiently) passivated, and to fractions (or pieces) of photovoltaic cells, hereinafter referred to as sub-cells, obtained by cutting.

The photovoltaic cell 20 may be a silicon heterojunction cell (SHJ), a so-called "tandem" cell comprising a silicon heterojunction cell and a perovskite cell stacked on top of each other or a silicon homojunction cell, for example of the PERT (passivated emitter and rear totally diffused) or TOPCon ("tunnel oxide passivated contact") type.

An SHJ cell comprises amorphous silicon which is known to degrade above a threshold temperature. This threshold temperature, known as the amorphous silicon degradation temperature, can be between 190° C. and 320° C. depending on the method of deposition of amorphous silicon especially (this is referred to as a "low temperature" cell). For example, it is equal to 220° C.

In the case of an SHJ cell, the parameters E, V and L of the activation method are preferably chosen so that the plateau temperature $T_{plateau}$ (reached in a major part of the first face 20a and in particular in the centre of the first face 20a in FIGS. 3 and 5 or in the centre of the upper and lower halves of the first face 20*a* in FIG. 7) is lower than or equal to a degradation temperature of the SHJ cell, and preferably lower than or equal to 220° C. The degradation temperature of the SHJ cell is preferably equal to the degradation temperature of amorphous silicon. However, another material could limit the degradation temperature of the SHJ cell.

The parameters E, V and L are furthermore advantageously chosen so that the maximum temperature $T_{max}$ (reached at the edge where the passivation layer 10 is located) is between 200° C. and 350° C. A portion of the SHJ cell can withstand a maximum temperature $T_{max}$ higher than the degradation temperature only for a given exposure time. For example, at 280° C., the SHJ cell is not degraded if the exposure time is less than 30 s.

A silicon homojunction cell (PERC, TOPCon . . . ) can withstand higher temperatures than an SHJ cell (referred to as a "high temperature" cell). The degradation temperature of a homojunction cell is usually between 400° C. and 500° C. The parameters E, V and L of the activation method are then preferably chosen so that the plateau temperature $T_{plateau}$ is less than or equal to this degradation temperature, and preferably less than or equal to 400° C. The parameters E, V and L are also advantageously chosen so that the maximum temperature $T_{max}$ is between 200° C. and 800° C. Again, each maximum temperature value $T_{max}$ above the degradation temperature is associated with a maximum exposure time value.

Conversely, a tandem cell can withstand lower temperatures than an SHJ cell. The degradation temperature of a tandem cell is about 120° C. The parameters E, V and L of the activation method are then preferably chosen so that the plateau temperature $T_{plateau}$ is less than or equal to the degradation temperature of the tandem cell, that is less than or equal to 120° C. The parameters E, V and L are also advantageously chosen so that the maximum temperature $T_{max}$ is between 100° C. and 200° C. Again, each maximum temperature value $T_{max}$ above the degradation temperature (here 120° C.) is associated with a maximum exposure time value (for example, a few seconds at 200° C.).

Whatever the type of photovoltaic cell, the step of exposing to the electromagnetic radiation may comprise several successive sweep phases, for example by moving the photovoltaic cell 20 several times in front of the same source of radiation 40 (by virtue in particular of a looped path), by multiplying the number of sources of electromagnetic radiation 40 or by making several round trips with the same line 60 of electromagnetic radiation. Several successive sweep phases make it possible to accumulate exposure time of the passivation layer at the temperature $T_{max}$ (also called a thermal activation temperature), and thus to maximise the passivation effect. Two successive sweep phases are advantageously spaced (in time) with a cooling phase of the photovoltaic cell. The number of sweep phases depends on the desired total exposure time.

Since the activation temperature for an SHJ or tandem cell is lower than that of a homojunction cell, the exposure time of the SHJ or tandem cell should be longer than that of the homojunction cell. The SHJ cell and the tandem cell are therefore more likely to be exposed several times in succession.

FIGS. 11A to 11C show a preferred embodiment of a method for manufacturing photovoltaic sub-cells according to a second aspect of the invention. A photovoltaic sub-cell here refers to a fraction or piece of a full size photovoltaic cell, also referred to as a "whole" photovoltaic cell. Photovoltaic sub-cells are, for example, intended for the manufacture of photovoltaic modules with low resistive losses compared to conventional photovoltaic modules (comprised of whole photovoltaic cells).

This manufacturing method comprises a step S1 of cutting full size photovoltaic cells 100 into a plurality of sub-cells 200 (see FIGS. 11A-11B) and a step S2 of passivating the sub-cells 200 (see FIG. 11C). For the sake of clarity, only one photovoltaic cell 100 and one sub-cell 200 have been represented (in a cross-sectional view) in FIGS. 11A and 110 respectively.

The photovoltaic cells 100 have been previously manufactured from semiconductor substrates, for example crystalline silicon. These substrates have initially been cut from a silicon ingot, and then subjected to several manufacturing steps (for example surface structuring, doping, annealing, passivation, screen printing steps, etc.), but no further cutting steps.

The photovoltaic cells 100 each comprise a first face 100*a*, a second face 100*b* opposite to the first face 100*a*, and side surfaces or walls 100*c* connecting the first face 100*a* and the second face 100*b*.

Preferably, the photovoltaic cells 100 are ready to be interconnected in a cell string. They are provided on the first face 100*a* and/or on the second face 100*b* with one or more metallisations 110 for collecting photogenerated charge carriers and receiving interconnection elements, for example metallic wires or ribbons. The metallisations 110 are preferably electrically conductive tracks called "busbars". The busbars 110 may electrically connect collection fingers (not represented in FIG. 11A) distributed over the entire surface area of the first face 100*a* and/or the second face 100*b*. One of the first and second faces 100*a*-100*b* (the back face) of the photovoltaic cells 100 may be fully metallised as well. In one alternative embodiment, the photovoltaic cells 100 are devoid of busbars 110 but comprise only collection fingers.

Advantageously, the first face 100*a* and the second face 100*b* of each photovoltaic cell 100 have a passivation layer 120. This passivation layer 120 makes surface defects of the photovoltaic cell 100 inactive and improves lifetime of the charge carriers photogenerated. Preferably, the passivation layer 120 also covers the side surfaces 100*c* of the photovoltaic cell 100.

In this preferred embodiment, cutting of each photovoltaic cell 100 is carried out in two successive operations F1 and F2, illustrated in FIGS. 11A and 11B respectively.

Operation F1 is a so-called cutting initiation operation which consists in exposing one of the first and second faces of the photovoltaic cell 100 (the first face 100*a* in the example of FIG. 11A) to a laser 130 in order to form a trench 140. The depth of the trench 140 is strictly less than the thickness of the photovoltaic cell 100. The depth of the trench 140 is preferably between 50 μm and 150 μm, whereas the thickness of the photovoltaic cell 100 is typically between 150 μm and 200 μm.

To limit damage to the cell on either side of the trench 140, the laser 130 is advantageously pulsed, with pulses having a duration between $10^{-6}$ s and $10^{-15}$ s.

The formation of the trench 140 by means of the laser 130 creates a brittleness zone which facilitates mechanical cleavage of the cell, during operation F2 (see FIG. 11B). The mechanical cleavage takes place in the plane of the trench 140, at the start thereof, preferably by exerting identical forces on either side of the trench 140.

The photovoltaic cells 100 are preferably cut into two sub-cells 200 with the same surface area (see FIG. 11B), thereby called "half-cells", or into sub-units with a surface area smaller than that of a half-cell, typically into three, four, five or six sub-cells 200 of the same surface area (the sub-cells 200 are then thirds, quarters, fifths or sixths of a cell). Cutting of the photovoltaic cells 100 can be fully automated.

Each sub-cell 200 comprises a first face 200a and a second face 200b, corresponding respectively to part of the first face 100a and part of the second face 100b of the photovoltaic cell 100 from which the sub-cell 200 originates. Each sub-cell 200 may further have one or more side surfaces 200c each corresponding to all or part of a side surface 100c of the photovoltaic cell 100. The first face 200a, the second face 200b and the side surfaces 200c of the sub-cells 200 are thus advantageously covered with the passivation layer 120.

Like the photovoltaic cells 100, the sub-cells 200 are ready to be interconnected. Part of the metallisations 110 of the photovoltaic cell 100 is present on the first face and/or on the second face of each sub-cell 200.

Each sub-cell 200 also comprises one or more additional side surfaces 200c' resulting from cutting of the photovoltaic cell 100. These additional side surfaces 200c' constitute zones where the semiconductor material (e.g. silicon) has been exposed. In other words, these additional side surfaces 200c' are free of passivation layer, unlike the first face 200a, the second face 200b and (possible) other side surfaces 200c of the sub-cell 200. For example, when a photovoltaic cell 100 is cut into four parallel cell strips, two cell strips have two unpassivated parallel edges, and two other cell strips have a single unpassivated edge.

With reference to FIG. 11C, the manufacturing method then comprises a step S2 of passivating at least one cut edge of the sub-cells 200, and preferably all the cut edges. This step aims at neutralising defects of the additional side surface 200c' corresponding to said cut edge, and preferably of all the additional side surfaces 200c'. In this way, it is possible to limit decrease in photovoltaic efficiency of the sub-cells 200 that is related to the generation of new edge(s) by cutting.

The passivation step S2 comprises a sub-step of depositing a passivation layer 210 onto said at least one additional side surface 200c' of the sub-cells 200 and a sub-step of activating the passivation layer 210 of the sub-cells 200.

The passivation layer 210 consists, for example, of alumina ($Al_2O_3$), silicon dioxide ($SiO_2$), silicon nitride ($Si_3N_4$) or amorphous hydrogenated silicon nitride (a-$Si_xN_y$:H). It can be formed by atomic layer deposition (ALD) or by chemical vapour deposition (CVD), plasma-assisted (PEALD or PECVD) or not. It can also be obtained by spatial atomic layer deposition (SALD).

The deposition of the passivation layer 210 can be carried out on several sub-cells 200 simultaneously, in particular by means of the passivation method described in international application WO2020/127896.

The passivation step S2 may also include a sub-step of implanting hydrogen ions into the passivation layer 210, after its deposition and before its activation.

Activation of the passivation layer 210 of the sub-cells 200 is accomplished by means of the activation method described above, for example by moving the sub-cells 200 under the radiation source 40.

When the sub-cells 200 are half-cells, each sub-cell 200 comprises only one edge to be passivated. The thermal activation method according to FIG. 2 is advantageously employed (by orienting each sub-cell 200 so that the edge to be passivated corresponds to the trailing edge).

When the sub-cells 200 are quarter cells, obtained by cutting a photovoltaic cell 100 along a first direction and a second perpendicular direction, each sub-cell 200 comprises two adjacent edges to be passivated. The thermal activation method according to FIG. 4 is advantageously employed.

When the sub-cells 200 are cell strips, obtained by cutting a photovoltaic cell 100 in parallel directions, each sub-cell 200 comprises one edge to be passivated or two parallel edges to be passivated. The thermal activation method according to FIG. 2 (single or round trip sweeping) or according to FIG. 6 is advantageously used.

As illustrated in FIG. 11C, the deposition conditions may be chosen such that the passivation layer 210 additionally covers a strip 200d of the laser-impacted face (the first face 200a in the example of FIGS. 11A-110). This strip is contiguous with the additional side surface 200c' covered with the passivation layer 210. Thus, defects created by the laser in the first face or the second face of the sub-cells 200, in the vicinity of the cut edges, can be neutralised in the same way as the defects present on the additional side surface 200c'.

Depositing the passivation layer 210 onto the laser-impacted face and onto the side surface 200c' is advantageously carried out in a single operation (for example using ALD or SALD techniques).

When the sub-cell 200 comprises a plurality of additional side surfaces 200c' and a plurality of these are passivated in step S2, the passivation layer 210 advantageously covers a plurality of strips 200d of the laser-impacted face, each strip 200d being contiguous with one of the additional side surfaces 200c' passivated.

The activation method and the sub-cell manufacturing method according to the invention are not limited to the embodiments described above and many alternatives and modifications will become apparent to the skilled person.

In particular, it is possible to passivate the four side surfaces 20c of the photovoltaic cell 20 by conducting two successive exposure steps. For example, one exposure step may use a line 60 comprised of a line segment 61 (see FIG. 2) to passivate the leading edge 21 and trailing edge 22 (by performing at least one round trip) and the other exposure step may use an arrow-shaped line 60 (see FIG. 2) to passivate both transverse edges 23-24 (upper and lower). Two radiation sources 40 may thus be provided to generate both types of line.

Alternatively, sweeping of the photovoltaic cell 20 by the electromagnetic radiation line 60 (at sweep speed V) may be achieved by other means than a relative translational movement between the photovoltaic cell 20 and the radiation source 40. The radiation source 40 may especially be pivotable and the photovoltaic cell 20 stationary.

Finally, in step S1 of the sub-cell manufacturing method (see FIGS. 11A-11B), the full-size photovoltaic cells 100 can be cut by a technique other than laser pre-cutting followed by mechanical cleaving, for example by laser alone, with or without laser-induced thermal separation and possible cooling, by mechanical cleaving alone or by mechanical grooving.

The invention claimed is:

1. A method for thermally activating a passivation layer disposed on a photovoltaic cell, the photovoltaic cell comprising a first face, a second face opposite to the first face, and side surfaces connecting the first and second faces, the passivation layer covering at least one of the side surfaces of the photovoltaic cell, the method comprising exposing the first face to electromagnetic radiation emitted by a radiation source, wherein the electromagnetic radiation is applied to the first face along a line, wherein the line sweeps at least part of the first face, resulting in an overheating zone adjacent to one or more edges of the first face, and wherein the line is oriented with respect to the first face such that the overheating zone encompasses at least part of the passivation layer.

2. The method according to claim 1, wherein the photovoltaic cell and the radiation source are in relative translation movement.

3. The method according to claim 1, wherein the first face comprises:

a first edge referred to as a leading edge;

a second edge referred to as a trailing edge and opposite to the first edge; and third and fourth edges connecting the first and second edges.

4. The method according to claim 3, wherein:

the passivation layer covers the side surface bordered by the trailing edge; and the line comprises a line segment oriented perpendicular to a median of the first face, the median passing through the leading edge and the trailing edge.

5. The method according to claim 1, wherein:

the passivation layer comprises a first portion covering the side surface bordered by the trailing edge and a second portion covering the side surface bordered by the leading edge; and the line sweeps the first face in a first direction during a first phase and in a second, opposite direction during a second phase.

6. The method according to claim 3, wherein:

the passivation layer comprises a first portion covering the side surface bordered by the trailing edge and a second portion covering the side surface bordered by one of the third and fourth edges; and the line comprises a line segment tilted with respect to a median of the first face by an angle strictly less than 90° in absolute value, the median passing through the leading edge and the trailing edge.

7. The method according to claim 3, wherein:

the passivation layer comprises a first portion covering the side surface bordered by the third edge and a second portion covering the side surface bordered by the fourth edge; and the line is a broken line comprising a first line segment tilted with respect to a median of the first face by a first positive angle and a second line segment tilted with respect to the median by a second negative angle, the median passing through the leading edge and the trailing edge, the first angle and the second angle being less than 90° in absolute value.

8. The method according to claim 7, wherein the first angle and the second angle are between 10° and 20° in absolute value.

9. The method according to claim 7, wherein the first angle and the second angle are equal in absolute value.

10. The method according to claim 1, wherein the line sweeps the entire surface area of the first face.

11. The method according to claim 1, wherein an energy surface density received at any point on the first face is between 1 kJ/m$^2$ and 1000 KJ/m$^2$.

12. The method according to claim 1, wherein the electromagnetic radiation has an irradiance greater than or equal to 1 kW/m$^2$.

13. The method according to claim 1, wherein the photovoltaic cell and the radiation source are in relative translation movement at a movement speed between 1 cm/s and 100 cm/s.

14. The method according to claim 1, wherein the line has a width between 0.1 mm and 100 mm.

15. A method for manufacturing passivated photovoltaic sub-cells, comprising:

cutting photovoltaic cells to form a plurality of photovoltaic sub-cells, each photovoltaic sub-cell comprising a first face, a second face opposite to the first face, and side surfaces connecting the first and second faces, at least one of the side surfaces of each photovoltaic sub-cell, resulting from cutting of the photovoltaic cells, is an additional side surface;

depositing a passivation layer onto the additional side surface of each photovoltaic sub-cell, and thermally activating the passivation layer of each photovoltaic sub-cell by exposing each first face to electromagnetic radiation emitted by a radiation source, wherein the electromagnetic radiation is applied to each first face along a line, wherein the line sweeps at least part of each first face, resulting in an overheating zone adjacent to one or more edges of each first face, and wherein the line is oriented with respect to each first face such that the overheating zone encompasses at least part of the passivation layer.

16. The manufacturing method according to claim 15, wherein the photovoltaic cells are cut into half-cells or sub-units with a surface area smaller than that of a half-cell.

17. The method according to claim 7, wherein the first angle and the second angle being less than 45° in absolute value.

18. The method according to claim 11, wherein the energy surface density received at any point on the first face is between 10 kJ/m$^2$ and 100 KJ/m$^2$.

19. The method according to claim 12, wherein the electromagnetic radiation has an irradiance between 100 kW/m$^2$ and 5000 kW/m$^2$.

20. The method according to claim 13, wherein the photovoltaic cell and the radiation source are in relative translation movement at a movement speed greater than or equal to 2 cm/s.

* * * * *